United States Patent [19]
Mahant-Shetti et al.

[11] Patent Number: 5,892,471
[45] Date of Patent: Apr. 6, 1999

[54] APPARATUS AND METHOD FOR CURRENT STEERING DIGITAL-TO-ANALOG CONVERTER UNITS

[75] Inventors: Shivaling Mahant-Shetti, Garland; Kenneth M. Bell, Windom; Sami Kiriaki, Garland, all of Tex.

[73] Assignee: Texas Instruments Incorporated, Dallas, Tex.

[21] Appl. No.: 856,497

[22] Filed: May 14, 1997

[51] Int. Cl.$^6$ .................................................. H03M 1/66
[52] U.S. Cl. .......................................... 341/135; 341/144
[58] Field of Search .................................... 341/135, 144, 341/118, 153, 145, 120

[56] References Cited

U.S. PATENT DOCUMENTS 5,703,587 12/1997 Clark et al. ............................ 341/144

Primary Examiner—Brian Young
Attorney, Agent, or Firm—Christopher L. Maginniss; W. James Brady, III; Richard L. Donaldson

[57] ABSTRACT

A metal-oxide-semiconductor digital-to-analog converter unit includes a multiplicity of current mirror components 20 in a symmetric array, a resistance network activated by voltage sources providing weighted biasing potentials for the current mirror components, and an electrical coupling of the current mirror components to compensate for variations physical properties across converter unit substrate area. The current mirror components 20 include a current steering portion $21_0$–$21_{N-1}$ and $25_0$–$25_{N-1}$ coupled to an annular bias transistor 22. The resulting digital-to-analog converter has improved performance characteristics when compared to previously implemented digital-to-analog converter units.

22 Claims, 4 Drawing Sheets

APPARATUS AND METHOD FOR CURRENT STEERING DIGITAL-TO-ANALOG CONVERTER UNITS

BACKGROUND OF THE INVENTION

1. Field of the Invention

The present invention relates generally to digital-to-analog converter units and, more particularly, to digital-to-analog converter units based on current mirror techniques. In the conventional implementation of a digital-to-analog converter unit, a constant current flows through the unit while the digital input signals steer or divide the current between two conductors, the difference in the divided current resulting in a current mode representation of the digital word or data group.

2. Description of the Related Art

Referring to FIG. 1, the general structure of an digital-to-analog converter unit 10 based on current mirror techniques, according to the related art, is shown. Digital input signals are applied to current mirror 11. Current mirror 11 provides two output currents, $I_0$ and $I_1$. The sum of these two output currents is a constant. The digital input signals determine the division of the current between $I_0$ and $I_1$. The currents $I_0$ and $I_1$ flow through resistors 12 and 13, respectively. The detection unit 14 provides an analog output signal determined the voltages across resistors 12 and 13. This analog output signal is a result of the digital input signals applied to the current mirror 11.

The current mirror-based digital-to-analog converter units rely on the property of a current mirror circuit to replicate a selected unit current. Well designed current mirror units generally have an accuracy of 1%. The current matching between two similar metal-oxide-semiconductor (MOS) transistors operated with similar gate voltages and drain voltages is determined by variations in the diffusion widths, in the poly-silicon widths, in the gate oxide thickness, and ground potential. The present accuracy in current matching was achieved by reducing these variations during the fabrication of the converter units. In spite of improvements, digital-to-analog converter units with even greater accuracy are needed.

A need has therefore been felt for a digital-to-analog converter unit and a related method with a higher accuracy than has been possible with conventional techniques.

SUMMARY OF THE INVENTION

The aforementioned and other features are accomplished, according to the present invention, by providing an array of current mirror components which are divided into groups having components which are mutually symmetric with respect to the center of the component array, by providing a resistive network which supplies weighted gate voltages used to the bias the current mirror components, and by implementing the current steering portions of the current mirror components with an annular transistor configuration.

These and other features of the present invention will be understood upon the reading of the following description in conjunction with the Figures.

BRIEF DESCRIPTION OF THE DRAWINGS

FIG. 3A is a block diagram showing the physical placement of a 4×4 array of current mirror components on a substrate, while

DESCRIPTION OF THE PREFERRED EMBODIMENT(S)

1. DETAILED DESCRIPTION OF THE DRAWINGS

Figure 2:
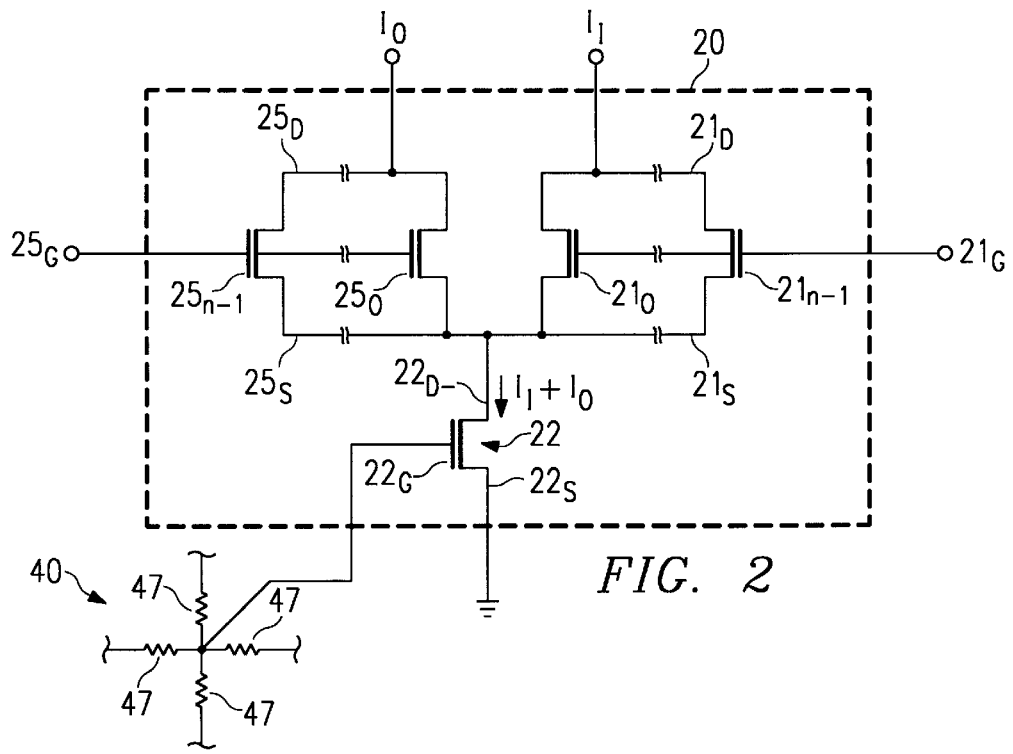
FIG. 2 is schematic circuit diagram of a current mirror component according to the present invention.

Referring to FIG. 2, a schematic circuit diagram of a current mirror component 20 used in the preferred embodiment of the present invention is shown. The current mirror 20 has a negative channel field effect transistor 22 acting as a bias transistor. The source terminal 22S of transistor 22 is coupled to the ground potential. The gate terminal 22G of transistor 22 is coupled to a network or grid of resistors 47 which will be described below. The drain terminal $22_D$ of transistor 22 is coupled to the source terminals $25_S$ of a plurality of n-channel field effect transistors $25_0$–$25_{N-1}$ and to the source terminals $21_s$ of a plurality of n-channel field effect transistors $21_0$–$21_{N-1}$. The gate terminals of transistors $25_0$–$25_{N-1}$ are coupled to terminal $25_G$, while the gate terminals of transistors $21_0$–$21_{N-1}$ are coupled to terminal $21_G$. The drain terminals $25_D$ of transistors $25_0$–$25_{N-1}$ are coupled to an $I_0$ terminal while the drain terminals $21_D$ of transistors $21_0$–$21_{N-1}$ are coupled to an $I_1$ terminal. The group of transistors $25_0$–$25_{N-1}$ and the group of transistors $21_0$–$21_{N-1}$ complementary signals applied to the gate terminals $25_G$ and $21_G$, respectively, thereby determining whether the current through transistor 22 is applied to the $I_0$ terminal or to the $I_1$ terminal.

In the preferred embodiment, each current mirror has 16 transistors coupled to the $I_0$ terminal and 16 transistors coupled to the $I_1$ terminal.

Figure 1:
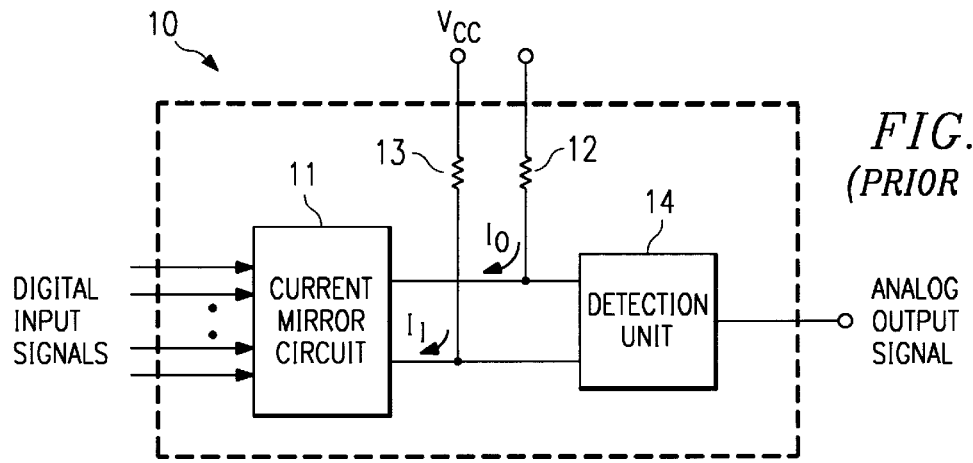
FIG. 1 is a block diagram of a current mirror-based digital-to-analog converter unit according to the prior art.
Figure 3A:
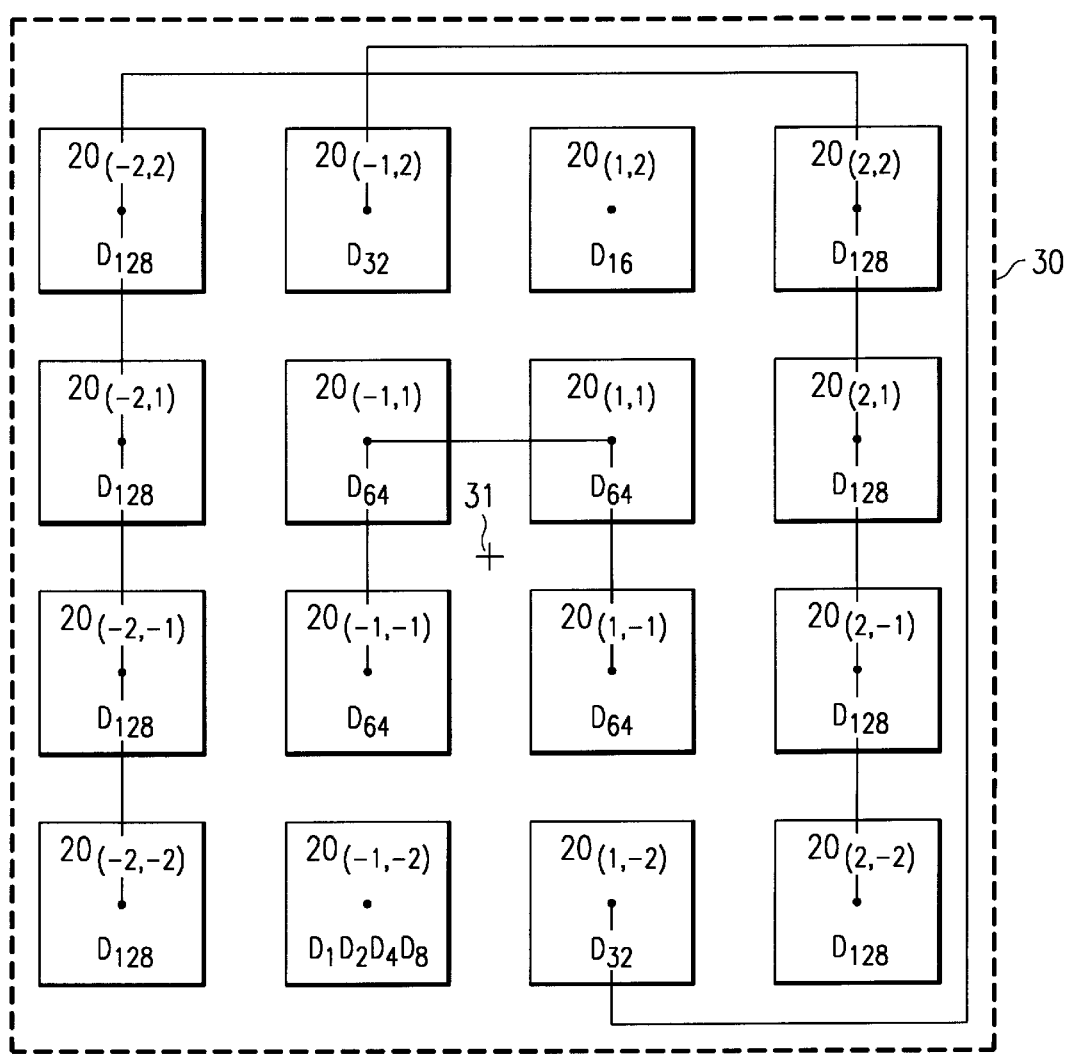

Referring to FIG. 3A, the physical placement of current mirror components 20 and 20' on a substrate 30 is shown. Each of the current mirror components 20 has gates of transistors $25_0$–$25_{N-1}$ coupled together and the gates of transistors $21_0$–$21_{N-1}$ coupled together. The converter unit has the digital (logic) signals $D_{256}$, $D_{128}$, $D_{64}$, $D_{32}$, and $D_{16}$, $D_8$, $D_4$, $D_2$, and $D_1$ applied thereto. One of the digital input signals $D_{16}$–$D_{256}$ is applied to one set of the coupled gates of each of the current mirror components 20, while the logical complement signal is applied to the other set of coupled gates in each current mirror component. For the current mirror component 20' shown at array location (1, 2) in FIG. 3A, a modified transistor gate coupling arrangement is implemented. The arrangement includes one transistor $21_0$ receiving the $D_1$ signal (i.e., the least significant logic signal) at the gate terminal, while one transistor $25_0$ receives the complement of the $D_1$ signal at its gate terminal in current mirror component 20'. Two transistors $21_{1-2}$ have the $D_2$ signal applied to their gate terminals, while two transistors $25_{1-2}$ have the complement of the $D_2$ signal applied to the gate terminals in current mirror component 20'. The $D_4$ signal is applied to four of the transistor $21_{3-6}$ gate terminals, while the complement of the $D_4$ signal is applied to four of the transistor $25_{3-6}$ gate terminals in current mirror component 20'. The $D_8$ signal is applied to eight of the gate terminals of transistors $21_{7-14}$, while the complement of the $D_8$ signal is applied to eight of the gate terminals of transistors $25_{7-14}$. Thus, the four least significant digital signals are applied to the mirror current component 20' at array position (1,2). The next most significant digital input signal $D_{16}$ is applied to the mirror current component 20 at array position (−1, −2) and, in the preferred embodiment, controls the current through 16 transistor pairs. The next most significant logic signal $D_{32}$ (controlling the current through 32 transistor pairs) is applied to the 2 mirror current components 20 at array positions (−1, 2) and (1, −2). The next most significant digital input logic signal $D_{64}$ (64 transistor pairs) is applied to the four mirror current components 20 at matrix positions (±1, ±1). The most significant input logic signal $D_{128}$ (128 transistor pairs) is applied to the eight mirror current components 20 at the matrix positions (±2, ±2) and (±2, ±1). As will be clear, each digital signal $D_N$ directs the current to the $I_0$ or the $\overline{I_0}$ conductor through the number of transistors equal to the number represented by the digital input signal.

Figure 3B:
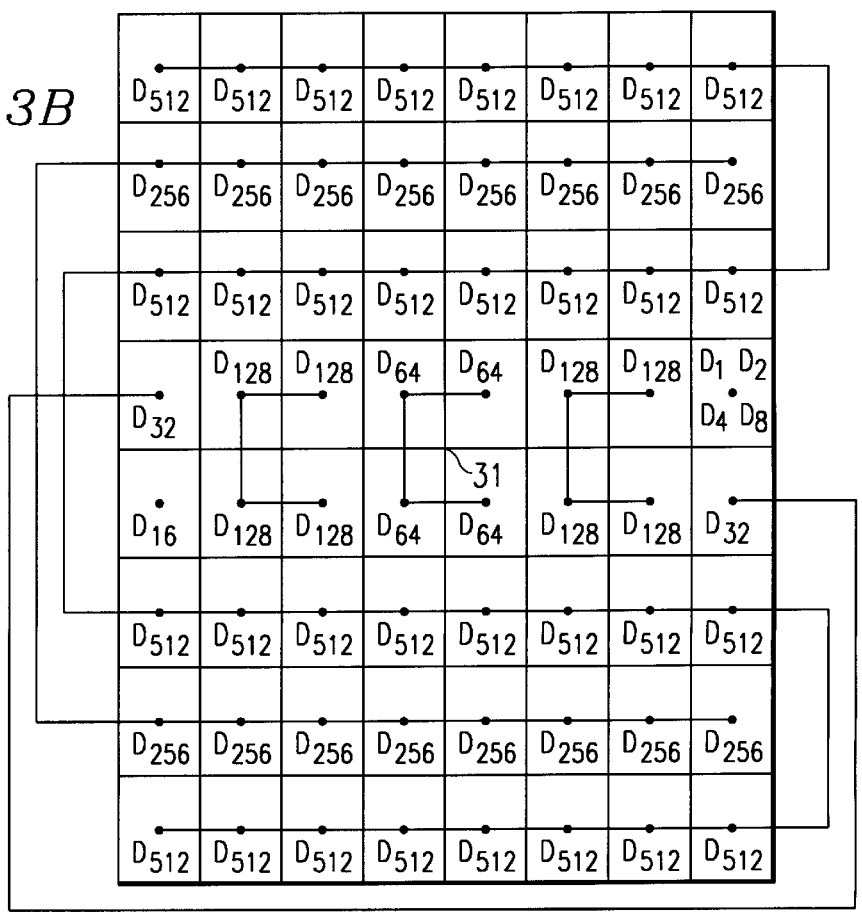
FIG. 3B is representative diagram showing the physical placement of an 8×8 arrangement of current mirror components on a substrate.

FIG. 3B illustrates the same axial symmetric positioning of the current mirror components except that, instead of a 4×4 array shown in FIG. 3A, an 8×8 array is shown. As in FIG. 3A, the reflection symmetry, also referred to an centroid symmetry, through axis 31 is clearly indicated.

Figure 4:
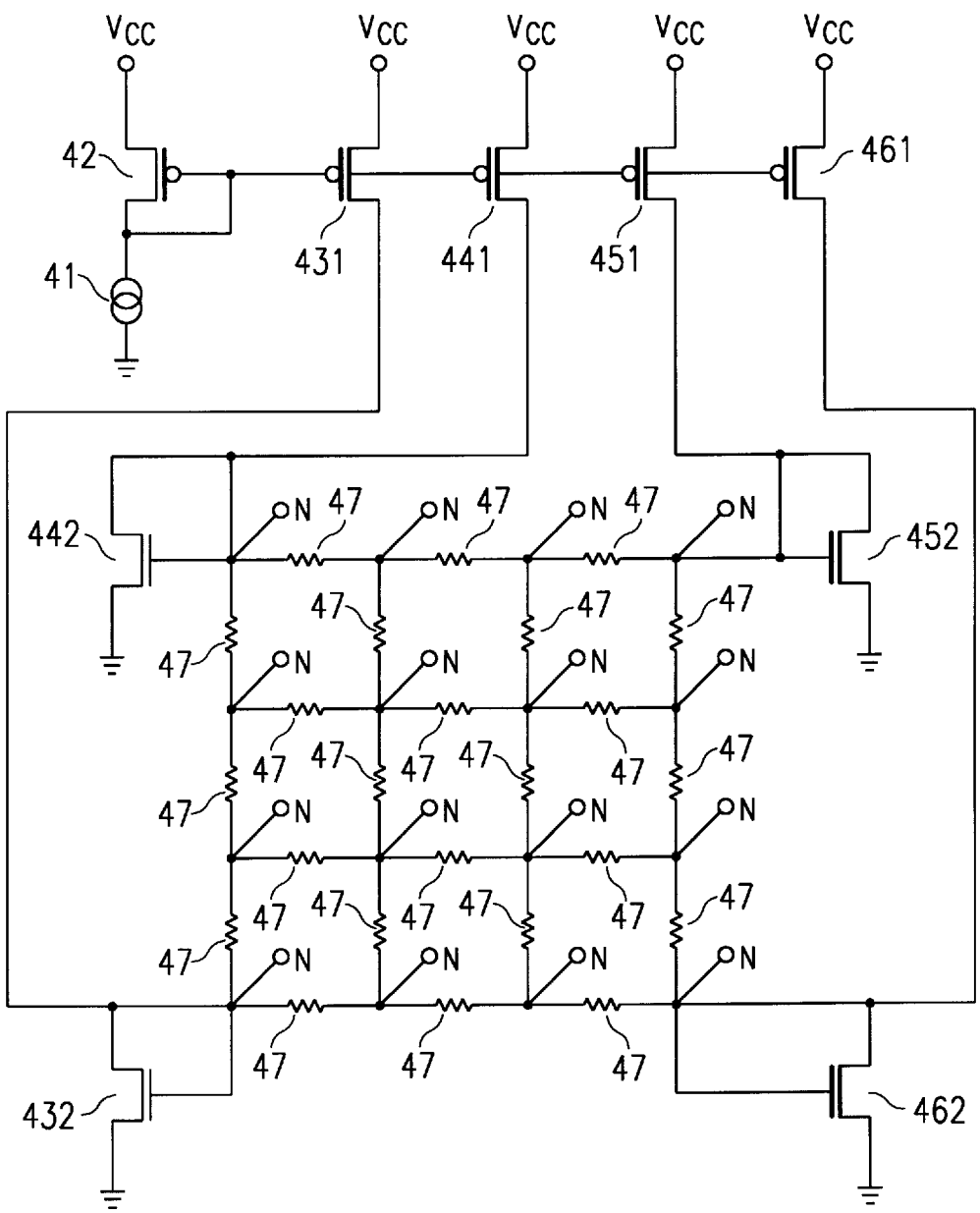
FIG. 4 is a schematic diagram of a resistor grid used to provide a weighted gate voltage for a 4×4 array of current mirror components.

Referring to FIG. 4, a first terminal of signal generator 41 is coupled the ground potential. A second terminal of signal generator 41 is coupled to a drain terminal and to gate terminal of p-channel field effect transistor 42, to gate terminal of p-channel field effect transistor 431, to a gate terminal of p-channel field effect transistor 441, to a gate terminal of p-channel field effect transistor 451, and to a gate terminal of p-channel field effect transistor 461. The source terminals of transistors 42, 431, 441, 451, and 461 are coupled to the supply terminal $V_{cc}$. The drain terminal' of transistor 431 is coupled to a drain and a gate terminal of n-channel field effect transistor 432. The drain terminal of transistor 441 is coupled to a drain terminal and a gate terminal of n-channel field effect transistor 442. The drain terminal of transistor 451 is coupled to a drain terminal and a gate terminal of n-channel field effect transistor 451. The drain terminal of transistor 461 is coupled to a drain terminal and a gate terminal of n-channel field effect transistor 462. The source terminals of transistors 432, 442, 452, and 462 are coupled to the ground potential. A three-by-three grid 40 of resistive elements 47 is formed such that the corners of the grid of resistors coupled to the drain terminals of transistors 432, 442, 452, and 462. The three-by-three grid 40 of resistive elements provides a four-by-four grid of nodes N where the resistive elements are coupled together. Each of the nodes N is coupled to a gate terminal of one of the current mirror component bias transistor.

Figure 5:
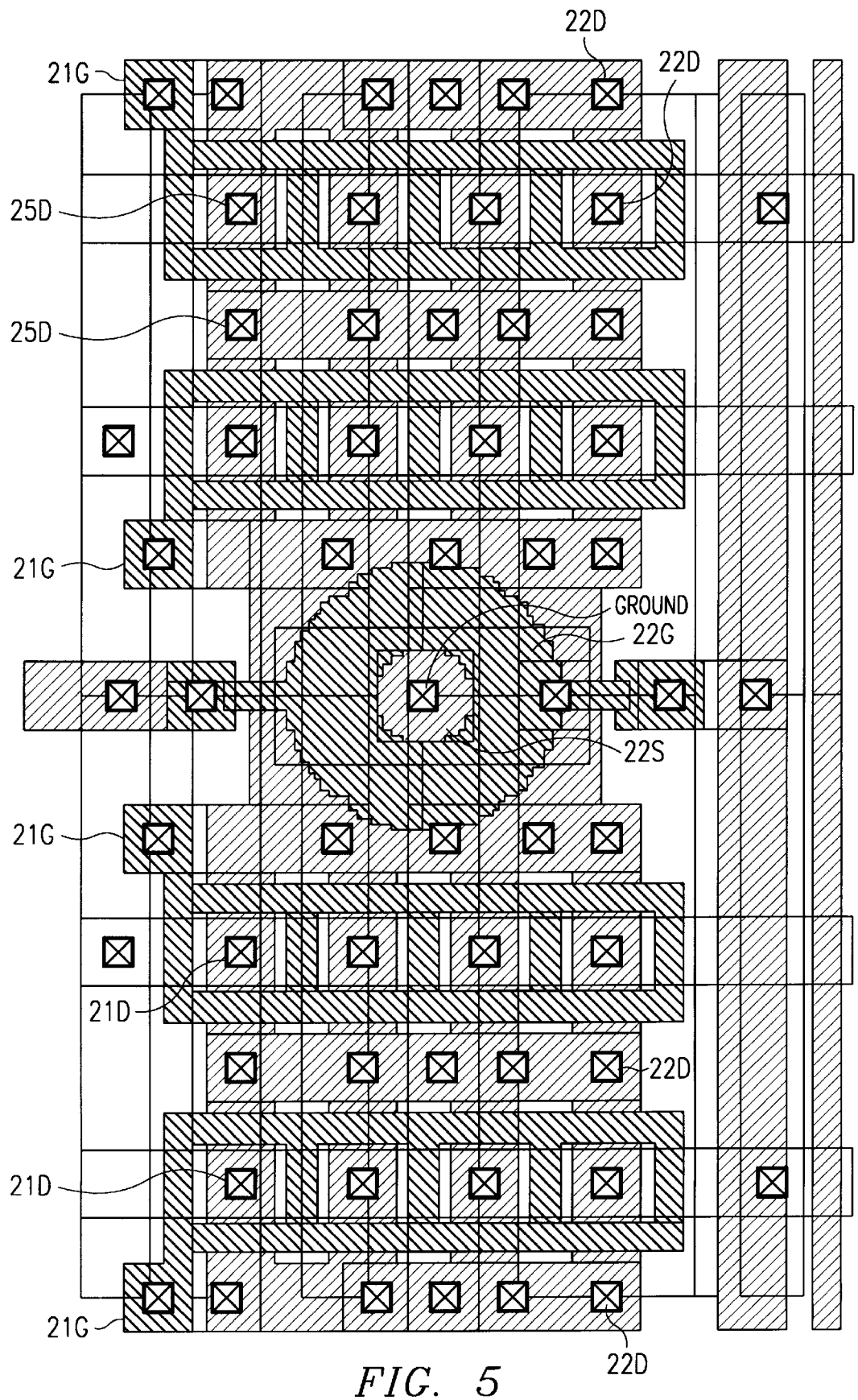
FIG. 5 is a top view of a layout of a current mirror component on a semiconductor substrate implementing the schematic diagram of a current mirror component shown in FIG. 2.

Referring to FIG. 5, a semiconductor layout implementing the current mirror component of FIG. 2 is shown. The realization of the elements in of FIG. 2 in FIG. 5 is indicated by the use of equivalent elements being numbered identically. The gate $22_G$ of bias transistor 22 demonstrates the origin of the term annular transistor, the gate terminal surrounding the transistor source terminal $22_S$. The annular transistor drain terminal $22_D$ is identical with the source terminals $21_S$ of transistors $21_i$ and is identical with the source terminals $25_S$ of transistors 25, the annular transistor drain terminal $22_D$ being coupled to the source terminal of transistors 21 and 25 by metal layers.

2. Operation of the Preferred Embodiment(s)

The digital-to-analog converter of the present invention involves a combination of several features which result in increased accuracy. First, a standard current mirror component is implemented using an annular transistor. In the preferred embodiment each component represents 16 unit currents and an array of such components forms a binary weighted current source. A differential approach is implemented with current steering for reduced voltage swings (i.e., higher speeds) as well as reduced ground voltage drops. In the annular transistor, the width-to length ratio is determined by poly-silicon length and is therefore relatively immune to dimensional variations. Because control of the poly-silicon length is tighter other process controls, the annular device reduces a major variation resulting from the fabrication of the device. (Other transistor implementations that define transistor width with the gate poly-silicon region can be used. However, the present approach will be best for length/width definition using only poly-silicon regions.) Symmetry with respect to all angles tends to reduce the $V_t$ mismatch as well.

Second, as illustrated in FIG. 3, the current mirror components (20) are physically positioned to provide a reflection symmetry through the axis at the center of the component array. The symmetry provides a compensation across the current mirror array for process variations during the fabrication of the converter unit.

In addition, instead of coupling all the bias transistor gates to a common potential, the two dimensional resistive element network, illustrated in FIG. 4, is employed. The two dimensional resistive element network is activated by at the corners of the network by diode-connected MOSFET transistors fed by equal currents. The corner potentials of the resistive element network are a function of the systematic gate-oxide thickness, the poly-silicon gate length, the ground potential drop, and the $V_t$ variations. The gate potential at a node of the resistive element network or grid is a weighted average of the voltage at the corners of the network. Therefore, the fraction of the undesired process variations that can be expressed as a linear function can be compensated for by the resistive element network.

(As will be clear, the diode-connected transistors can be positioned at more and/or at different locations to provide compensation for a more complicated gate potential profile.) The resistive elements can be the poly-silicon gate conductor itself, or any other suitable layer such as an n-well structure. In order to achieve a dense layout, small transistors operating in their linear region are preferred. A further improvement, not shown, is to implement the four current sources in p-channel technology. The small mismatch can be compensated for by scrambling the currents. The uniform current is thus achieved at the cost of additional noise.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. An integrated circuit digital-to-analog converter unit, said converter unit comprising:

a multiplicity of current mirror components, said current mirror components arranged in an array, each current mirror component including;

first and a second conductor, a current steering portion determining through which of said first and said second conductors a common current will flow in response to an first control signal, and a bias transistor coupled between ground and said current steering portion, said common current flowing through said bias transistor;

a plurality of voltage sources coupled to ground;

a network of resistors energized by said plurality of voltage sources, a gate terminal of each said bias transistor coupled to node of a network of resistors.

2. The converter unit of claim 1 wherein nodes of said network apply a weighted bias voltage to a coupled bias transistor.

3. The converter unit of claim 2 wherein said bias transistor is an annular transistor.

4. The converter unit of claim 1 wherein said voltage sources are diodes coupled in series with a current source.

5. The converter unit of claim 3 wherein said resistive elements of said network of resistors are implemented by conducting transistors.

6. The converter unit of claim 1 wherein said array of current mirror components is coupled in sets of current mirror components, a number of current mirror components in each set determined by numerical significance of a logic signal applied thereto.

7. The method of implementing an integrated circuit digital-to-analog converter unit, said method comprising the steps of:

arranging an array of current mirror components into sets, each set of current mirror components being axially symmetric about a center of said array; and applying a voltage to a gate of a bias transistor of each current mirror, said voltage compensating for ground currents.

8. The method of claim 7 wherein each set of current mirror components includes a number of transistor pairs equal to a number represented by a logic signal applied to said each set.

9. The method of claim 7 wherein said applying a voltage step includes the steps of:

activating a network of resistive elements by energizing sources in selected positions of a substrate upon which said converter unit has been fabricated; and coupling gates of said bias transistors to nodes of said network.

10. The method of claim 7 further including the step of implementing said resistive elements of said network with conducting transistors.

11. The method of claim 9 further comprising the step of implementing said bias transistors with annular transistors.

12. A digital-to-analog converter unit comprising:

a first conductor and a second conductor;

a multiplicity of current mirror components, said current mirror components coupled in groups current mirror components, each of said groups of current mirror components positioned with reflective symmetry about an axis of said multiplicity of components, each group of current mirror components applying current to a one of said first and said second conductors in response to a logic signal, wherein each current mirror includes a bias transistor; and a network of resistive elements, a gate of each bias transistor being coupled to a node of said network.

13. The converter unit of claim 12 wherein said bias transistors are annular transistors.

14. The converter unit of claim 12 wherein said network is energized by a plurality of energizing units, said network providing bias potentials for current mirror components compensating for ground currents.

15. The converter unit of claim 12 wherein said resistive elements are conducting transistors.

16. The converter unit of claim 12 wherein each group of current mirror elements includes a number of transistor pairs equal of the number represented by said logic signal.

17. The converter unit of claim 12 wherein a first current mirror component has a plurality of least significant logic signals applied thereto.

18. The converter unit of claim 17 wherein a second current mirror component is symmetrically positioned about said axis with respect to said first current mirror component, said second current mirror receiving a next most significant logic signal with respect to said least significant logic signals.

19. A integrated circuit digital-to-analog converter unit comprising:

a first and a second conducting path;

a multiplicity of current mirror components, said current mirror components divided to groups having a centroid symmetry with respect to a center of said current mirror components, each group of current mirror components responsive to a digital signal for determining to which of said first and said second conducting paths current transmitted by said each group is applied; and a resistive element network coupled to a control element of each of said current mirror components, said resistive element network applying a compensating voltage to said control elements.

20. The converter unit of claim 19 wherein each current mirror component includes an annular bias transistor, said control element being a gate terminal of said annular bias transistor.

21. The converter unit of claim 20 further comprising a plurality of energizing sources coupled to selected positions of a converter unit ground and energizing said resistive element network.

22. The converter unit of claim 21 wherein said resistive elements are conducting transistors.

* * * * *